United States Patent
Barden et al.

(10) Patent No.: US 11,982,694 B2
(45) Date of Patent: May 14, 2024

(54) ELECTRONIC DEVICE AND METHOD FOR OPERATING THE SAME

(71) Applicant: MGL GLOBAL SOLUTIONS LIMITED, Kowloon (HK)

(72) Inventors: David Barden, Brea, CA (US); Danny Swerkes, Brea, CA (US)

(73) Assignee: MGL GLOBAL SOLUTIONS LIMITED, Kowloon (HK)

( * ) Notice: Subject to any disclaimer, the term of this patent is extended or adjusted under 35 U.S.C. 154(b) by 171 days.

(21) Appl. No.: 17/231,265

(22) Filed: Apr. 15, 2021

(65) Prior Publication Data

US 2022/0334154 A1 Oct. 20, 2022

(51) Int. Cl.
*G01R 19/165* (2006.01)
*G08B 21/18* (2006.01)

(52) U.S. Cl.
CPC ..... *G01R 19/16571* (2013.01); *G08B 21/182* (2013.01)

(58) Field of Classification Search
CPC ............ G01R 19/16571; G01R 31/006; G08B 21/182
See application file for complete search history.

(56) References Cited

U.S. PATENT DOCUMENTS

| | | | |
|---|---|---|---|
| 6,479,968 B1 | 11/2002 | Pozsgay et al. | |
| 7,129,832 B2 * | 10/2006 | Sabatino | G01F 23/70 340/984 |
| 8,513,949 B2 * | 8/2013 | Bertness | H02J 7/1446 324/426 |
| 2009/0125179 A1 | 5/2009 | Miller et al. | |
| 2012/0029852 A1 * | 2/2012 | Goff | G01R 31/371 702/63 |
| 2012/0323435 A1 * | 12/2012 | Miller | G01R 19/0092 701/31.4 |
| 2014/0081509 A1 | 3/2014 | Koch et al. | |
| 2015/0217641 A1 * | 8/2015 | Slosarczyk | B60W 10/26 701/22 |
| 2017/0240126 A1 | 8/2017 | Kang et al. | |

FOREIGN PATENT DOCUMENTS

EP 2668061 12/2013

OTHER PUBLICATIONS

Extended European Search Report issued in Corresponding European Application No. 21168560.7, dated Oct. 5, 2021.
Klähn, Gerhard. "4 basic electrical parameters" *Electrical engineering textbook—Fundamentals of electrical engineering*, Nov. 30, 2015, https://www.elektrotechnik-lachbuch.de/e_grunflagen_kap_04_5v5.html. Accessed Sep. 24, 2021 (Translation provided).

* cited by examiner

*Primary Examiner* — Feba Pothen
(74) *Attorney, Agent, or Firm* — BACON & THOMAS, PLLC

(57) ABSTRACT

An electronic device and method for operating the same are provided. The electronic device includes a connector, a first measuring unit, a power source, and a switching unit. The switching unit is configured to switch the electronic device between a first operation mode and a second operation mode. When the first operation mode is selected, the first measuring unit is configured to be electrically coupled between the power source and the connector so as to measure a first electrical signal communicated between the power source and the connector.

17 Claims, 11 Drawing Sheets

ELECTRONIC DEVICE AND METHOD FOR OPERATING THE SAME

BACKGROUND

1. Technical Field

The present disclosure relates to an electronic device and a method for operating the same, and more particularly to an electronic device configured to be electrically coupled with an automotive electrical system and a method for operating the same.

2. Description of the Related Art

One of the key characteristics of a vehicle electrical system is the parasitic drain current. Excessive key-off parasitic drain current (e.g., more than 50 mA) may pull excessive power from a car battery, so that the car battery may not have sufficient power left to start the vehicle after sitting parked for a few days or even overnight. Thus, monitoring the parasitic drain current is crucial. However, placing a current meter (e.g., an ammeter) in-line between the car battery and battery cables inevitably leads to a temporary disconnection in the transmission path and thus results in a loss of power in the vehicle electrical system. The loss of power may result in some damage to the vehicle electrical system, such as the loss of an adaptation of fuel and spark controls.

SUMMARY

In some embodiments, an electronic device includes a connector, a first measuring unit, a power source, and a switching unit. The switching unit is configured to switch the electronic device between a first operation mode and a second operation mode. When the first operation mode is selected, the first measuring unit is configured to be electrically coupled between the power source and the connector so as to measure a first electrical signal communicated between the power source and the connector.

In some embodiments, an electronic device includes a connector and a main circuit. The main circuit is connected to the connector. The main circuit includes a switching unit, a measuring unit, and a power source. The switching unit is configured to switch the electronic device between a first operation mode and a second operation mode. The measuring unit is connected to the switching unit. The power source is connected to the switching unit. When the first operation mode is selected, the measuring unit measures a first drain current from the power source to the connector. When the second operation mode is selected, the measuring unit measures a second drain current from the connector.

In some embodiments, a method of operating an electronic device includes: switching the electronic device to a first operation mode; electrically coupling the electronic device to an external system through a connector of the electronic device; and measuring a first electrical signal communicated between the power source of the electronic device and the external system.

In some embodiments, a method of operating an electronic device includes: switching the electronic device to a first operation mode; measuring a first drain current from a power source of the electronic device to a connector of the electronic device; switching the electronic device to a second operation mode; and measuring a second drain current from the connector of the electronic device.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures can be arbitrarily increased or reduced for clarity of discussion.

DETAILED DESCRIPTION

Figure 1:
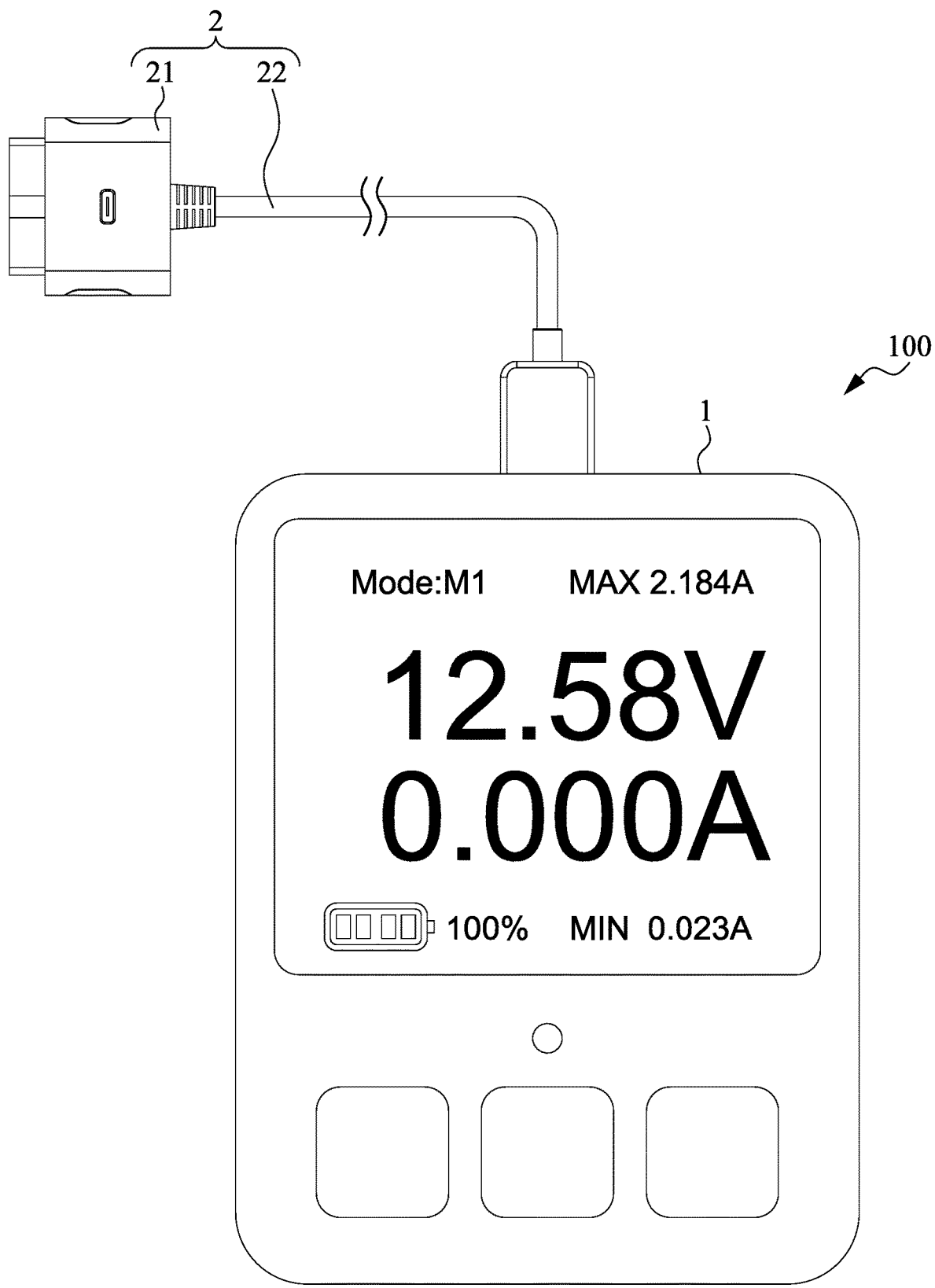
FIG. 1 illustrates a schematic diagram of an electronic device, according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features can be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a schematic diagram of an electronic device 100 according to some embodiments of the present disclosure. As shown, the electronic device 100 includes a main circuit 1 and a connecting element 2. The connecting element 2 may include a connector 21 and a cable 22 connected to the connector 21. The main circuit 1 can be connected to the connecting element 2. For example, the main circuit 1 may include a receiving port(s) connected to the cable 22. The connecting element 2 can be removable. The main circuit 1 can be disconnected from the connecting element 2. The receiving port(s) of the main circuit 1 can be disconnected from the cable 22.

The connector 21 may include an on-board diagnostic (OBD) male connector or OBD pin or the like. The cable 22 may include an OBD cable, a coaxial cable, or the like.

Figure 2:
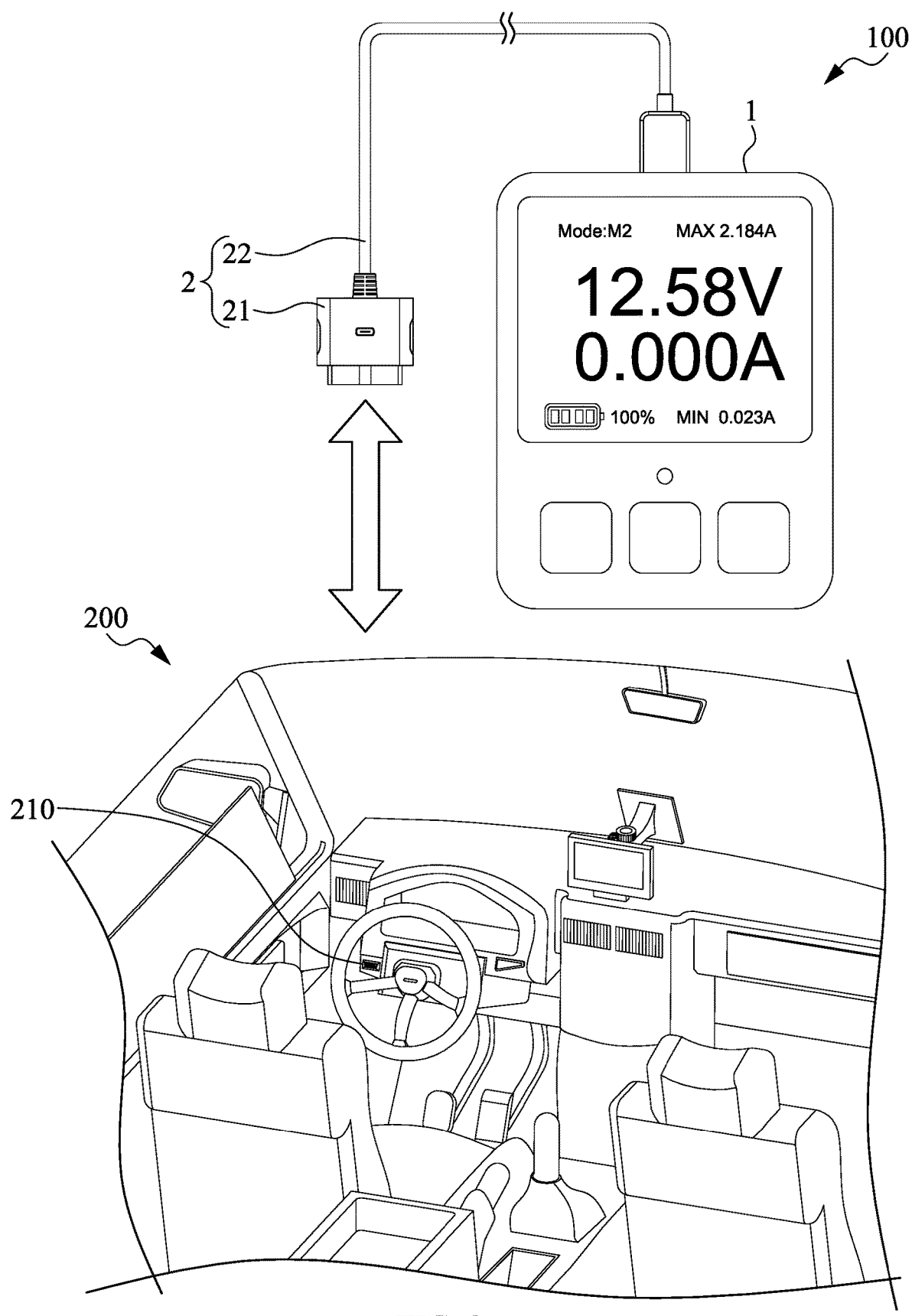
FIG. 2 illustrates a schematic diagram of an electronic device used in combination with a vehicle electrical system, according to some embodiments of the present disclosure.

FIG. 2 illustrates a schematic diagram of the electronic device 100 used in combination with a vehicle electrical system 200, according to some embodiments of the present disclosure. As shown, the vehicle electrical system 200 includes a connector 210. The electronic device 100 can be electrically coupled to the vehicle electrical system 200 when the connector 210 of the vehicle electrical system 200 is connected to the connector 21 of the electronic device 100. In some embodiments, the data of the vehicle electrical system 200 can be transmitted to the electronic device 100 through the connector 210, the connector 21 and the cable 22. In some embodiments, the data of the electronic device 100 can be transmitted to the vehicle electrical system 200 through the cable 22, the connector 21 and the connector 210. Furthermore, signals or commands can be communicated between the electronic device 100 and the vehicle electrical system 200. In addition, voltages or currents can be transmitted between the electronic device 100 and the vehicle electrical system 200.

The connector 210 may include an OBD female connector or OBD socket, a cigarette lighter socket, or the like.

Figure 3:
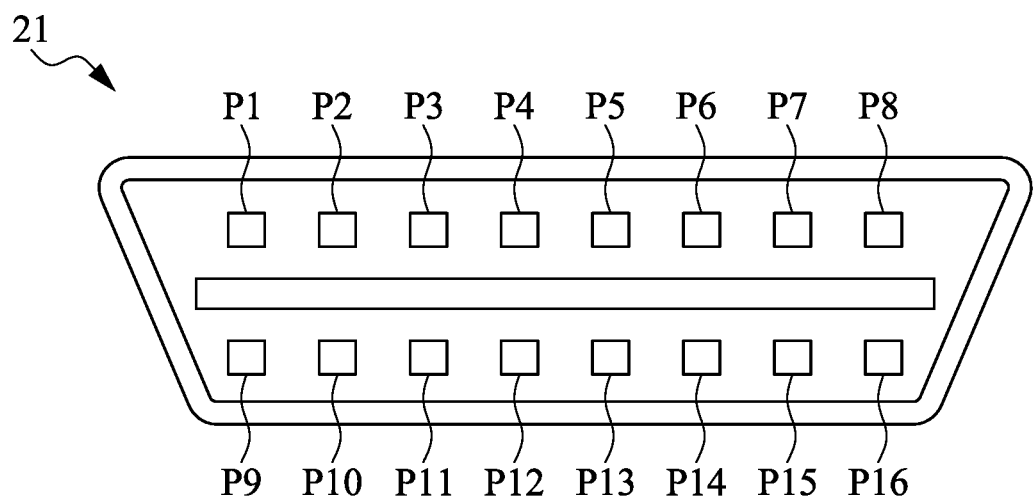
FIG. 3 illustrates a schematic diagram of a connector, according to some embodiments of the present disclosure.

FIG. 3 illustrates a schematic diagram of a connector (e.g., the connector 21) according to some embodiments of the present disclosure. As shown, the connector 21 includes a plurality of pins P1-P16. In some embodiments, the pins P1-P16 can be used for transmitting electrical signals between the electronic device 100 and an external system (e.g., the vehicle electrical system 200 in FIG. 2). The connector 210 of the vehicle electrical system 200 may include a plurality of pins corresponding to the pins P1-P16.

In some embodiments, the pins P1, P3, P8, P9, P12, and P13 can be used for various functions, for example, charge-coupled device (CCD) bus, revolutions per minute (RPM) signal, Ethernet transmit (TX), Ethernet receive (RX), etc. The functions of the pins P1, P3, P8, P9, P12, and P13 are determined by manufacturers. In some embodiments, the pin P2 can be used for a bus positive line of the pulse width modulation (PWM) or the varied pulse width (VPW) under an OBD protocol (e.g., SAE J1850 PWM and VPW). In some embodiments, the pin P4 can be used for chassis grounding. In some embodiments, the pin P5 can be used for signal grounding. In some embodiments, the pin P6 can be used for a controller area network (CAN) bus, e.g., CAN high. In some embodiments, the pin P7 can be used for a K-line bus. In some embodiments, the pin P10 can be used for a bus negative line of PWM or VPW under an OBD protocol (e.g., SAE J1850 PWM). In some embodiments, the pin P14 can be used for a CAN bus, e.g., CAN low. In some embodiments, the pin P15 can be used for an L-line bus. In some embodiments, the pin P16 can be used for connecting to a 12V or 24V battery.

Figure 4:
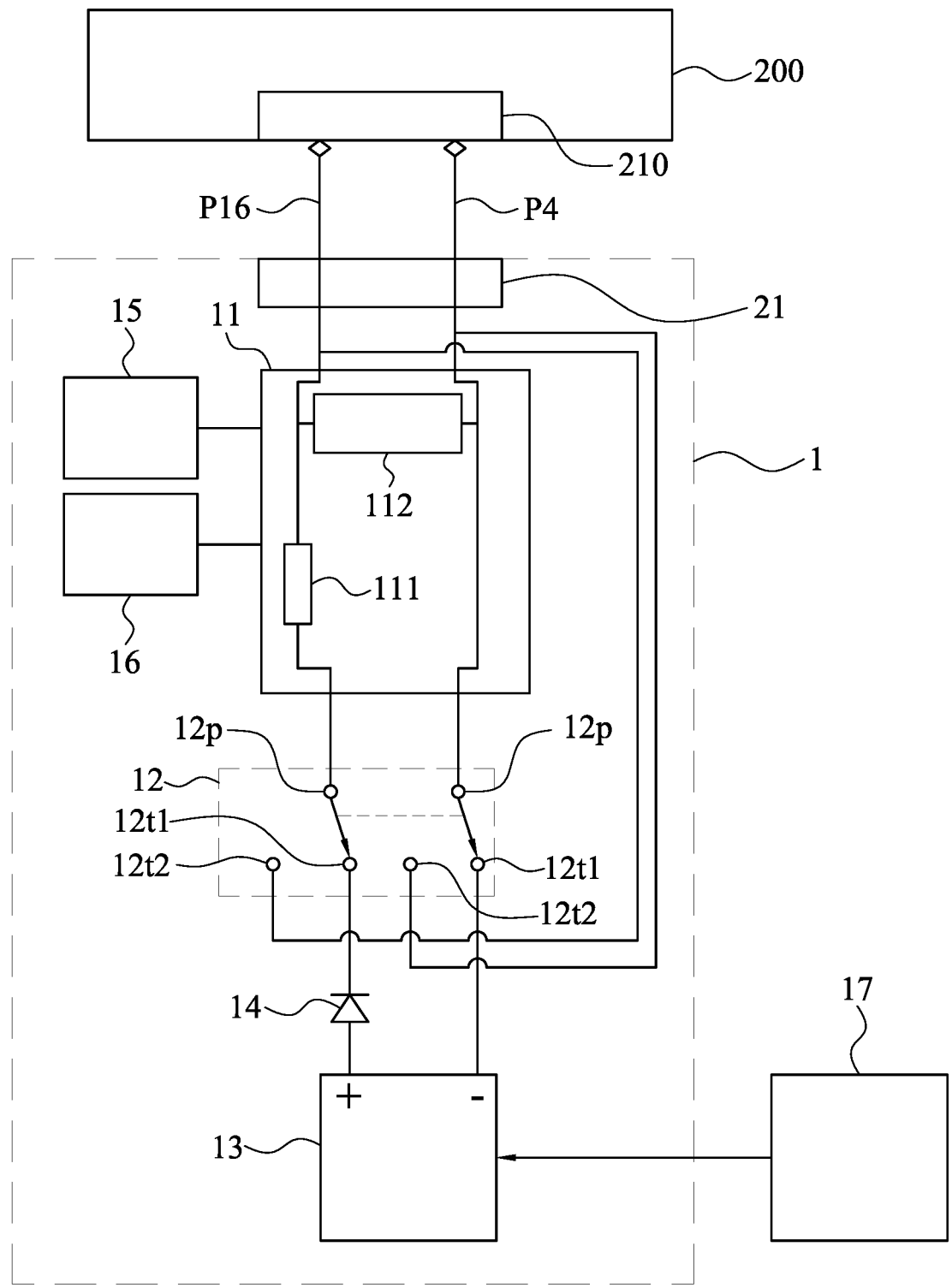
FIG. 4 illustrates a block diagram of an electronic device, according to some embodiments of the present disclosure.

FIG. 4 illustrates a block diagram of an electronic device (e.g., the electronic device 100) according to some embodiments of the present disclosure. As shown, the main circuit 1 of the electronic device 100 includes a measuring module (or a measuring unit) 11, a switching unit 12, a power source 13, an electronic component 14, a wireless communication module 15, and a display unit 16.

The main circuit 1 can be electrically connected to the vehicle electrical system 200 through the connection between the connector 21 and the connector 210. In some embodiments, the pin P4 and the pin P16 of the connector 21 can be connected to corresponding pins of the connector 210.

As shown in FIG. 4, the measuring module 11 can be electrically coupled to the vehicle electrical system 200 when the connector 21 and the connector 210 are connected. The switching unit 12 can be electrically coupled to the vehicle electrical system 200 when the connector 21 and the connector 210 are connected. The measuring module 11 can be connected to the switching unit 12. The measuring module 11 can be connected to the display unit 16. The measuring module 11 can be connected to the wireless communication module 15. The switching unit 12 can be connected to the power source 13. The electronic component 14 can be connected between the switching unit 12 and the power source 13.

The switching unit 12 can be configured to switch the electronic device 100 between a first operation mode M1 and a first operation mode M2. The switching unit 12 can be controlled manually or automatically.

Referring to FIG. 4, the main circuit 1 can be connected to a charger 17. The charger 17 can be configured to charge the power source 13. The charger 17 may include a 12V-5V USB charger.

Figure 5A:
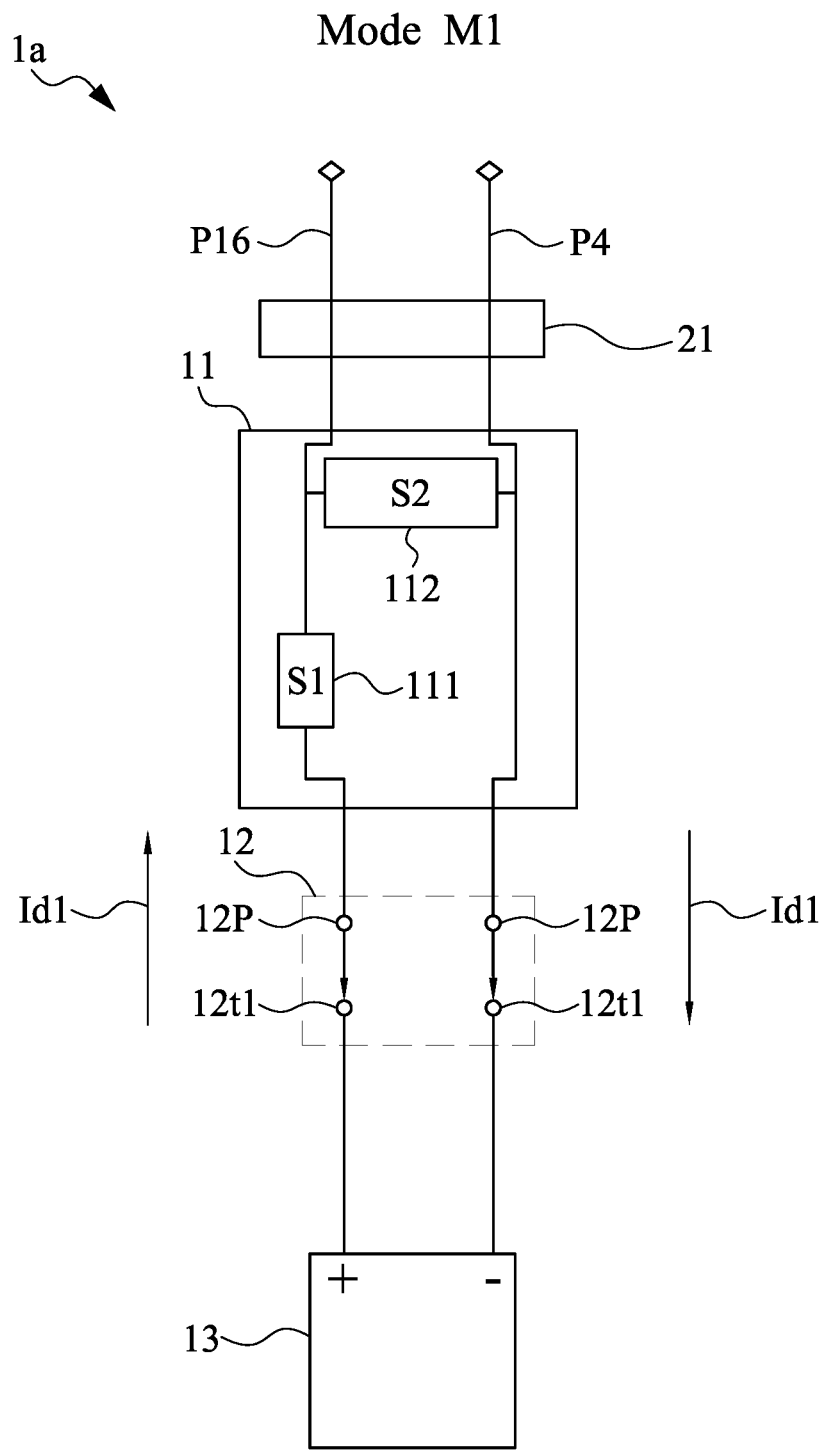
FIG. 5A illustrates an equivalent circuit of the electronic device shown in FIG. 4, according to some embodiments of the present disclosure.

FIG. 5A illustrates an equivalent circuit 1a of the electronic device 100 shown in FIG. 4 when the first operation mode M1 is selected, according to some embodiments of the present disclosure. The equivalent circuit 1a can include the measuring module 11, the switch 12, the power source 13, and the connector 21. Other elements of the electronic device 100 (e.g., the electronic component 14, the wireless transmission module 15, and the display unit 16) are omitted in the equivalent circuit 1a. The power source 13 and the measuring module 11 can be connected via the switch 12. When the first operation mode M1 is selected, the power source 13 can be configured to be electrically coupled to the measuring module 11 via the switching unit 12. When the first operation mode M1 is selected, the measuring module 11 can be electrically coupled between the power source 13 and the connector 21 so as to measure an electrical signal S1 communicated between the power source 13 and the connector 21.

As shown in FIG. 5A, the measuring module 11 includes a first measuring unit 111. The electrical signal S1 can be measured by the first measuring unit 111. The first measuring unit 111 can be configured to form a series circuit with the connector 21. The first measuring unit 111 can be configured to form a series circuit with the power source 13. In some embodiments, the electrical signal S1 can be a drain current Id1 from the power source 13 to the connector 21. The electrical signal S1 can be a drain current Id1 associated with the power source 13. In addition, the measuring module 11 may measure an electrical signal S2 when the electronic device 100 is switched to the first operation mode M1. The first measuring module 11 may include a second measuring unit 112. The electrical signal S2 can be measured by the second measuring unit 112. The second measuring unit 112 can be configured to form a parallel circuit with the connector 21. The second measuring unit 112 can be configured to form a parallel circuit with the power source 13. In some embodiments, the electrical signal S2 can be a voltage associated with the power source 13.

When the first operation mode M1 is selected, the power source 13 can be configured to be electrically coupled to vehicle electrical system 200 via the connector 21 (e.g., the pin P16). Meanwhile, it is allowable for a technician to remove a car battery from the vehicle electrical system 200, since the power source 13 can provide power to the vehicle electrical system 200 when a car battery is removed. When the car battery is removed from the vehicle electrical system 200, the drain current (or the electrical signal S1) measured by the first measuring unit 111 may correspond to the parasitic drain current of the vehicle electrical system 200.

Figure 5B:
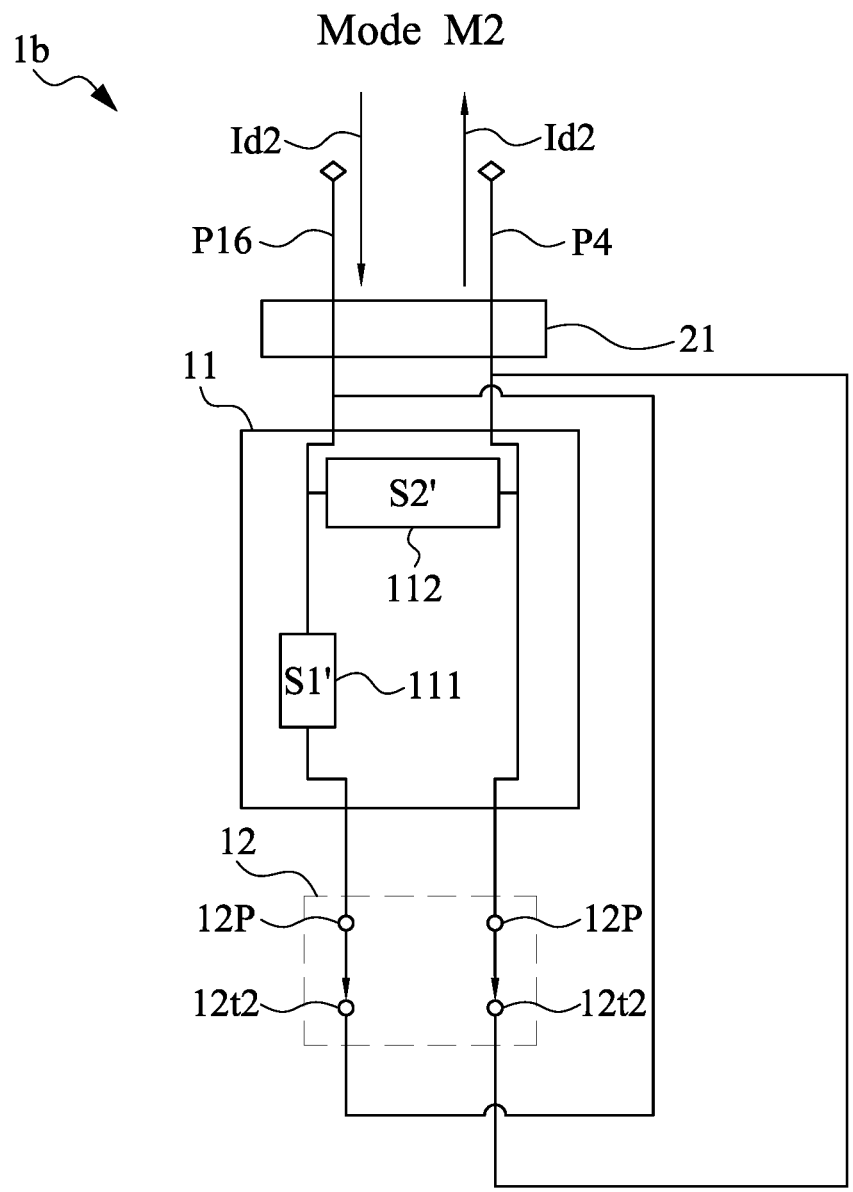
FIG. 5B illustrates an equivalent circuit of the electronic device shown in FIG. 4, according to some embodiments of the present disclosure.

FIG. 5B illustrates an equivalent circuit 1b of the electronic device 100 shown in FIG. 4 when the second operation mode M2 is selected, according to some embodiments of the present disclosure. The measuring module 11 and the connector 21 may form a circuit via the switch 12. When the second operation mode M2 is selected, the power source 13 can be electrically isolated from the connector 21 (e.g., the pin P16). The equivalent circuit 1b can include the measuring module 11, the switch 12, and the connector 21. Other elements of the electronic device 100 (e.g., the power source 13, the electronic component 14, the wireless transmission module 15, and the display unit 16) are omitted from the equivalent circuit 1b.

The first measuring unit 111 of the measuring module 11 may measure an electrical signal S1' when the electronic device 100 is switched to the second operation mode M2. The first measuring unit 111 can be configured to form a series circuit with the connector 21. The electrical signal S1' can be a drain current Id2 from the vehicle electrical system 200. The electrical signal S1' can be a drain current Id2 associated with the vehicle electrical system 200. In some embodiments, the value of the electrical signal S1 (or a drain current Id1 from the power source 13 to the connector 21) as measured in the first operation mode M1 can be substantially identical to the value of the electrical signal S1' (or a drain current Id2 from the connector 21) as measured in the second operation mode M2.

The second measuring unit 112 of the measuring module 11 can measure an electrical signal S2' when the electronic device 1 is switched to the second operation mode M2. The second measuring unit 112 can be configured to form a parallel circuit with the connector 21. In some embodiments, the electrical signal S2' can be a voltage associated with the car battery of the vehicle electrical system 200. In some embodiments, the value of the electrical signal S2 as measured in the first operation mode M1 can be substantially identical to the value of the electrical signal S2' as measured in the second operation mode M2.

In some comparative embodiments, a current meter is used for measuring a parasitic drain current of a vehicle electrical system. However, placing a current meter in-line between the car battery and battery cables inevitably leads a temporary disconnection in the transmission path and thus results in a loss of power in the vehicle electrical system. The loss of power may bring about some damage to the vehicle electrical system, such as the loss of an adaptation of fuel and spark controls or radio station presets. They have become more important ever since the vehicle electrical system includes digital computer modules to control engine operation. In the present disclosure, the electronic device 100 can be electrically coupled to the vehicle electrical system 200 via the connector 21 so as to measure the drain current of the vehicle electrical system 200, instead of placing a current meter in-line between the car battery and battery cables. As such, the present disclosure may prevent the temporary disconnection in the transmission path and thus prevent the loss of power. The electronic device 100 can be used for measuring the voltage associated with the car battery or the power source 13. Furthermore, since the electronic device 100 provides the power to the vehicle electrical system 200, a car battery can be removed for repair or replacement without any concerns about a loss of power. The adaptation or presets stored in the vehicle electrical system 200 can also be retained. In other words, the vehicle electrical system 200 is free from losing important programs which have been written in the digital computer modules when the vehicle electrical system 200 is being tested by using the electronic device 100.

In some embodiments, the switching unit 12 may configured to select N operation modes, wherein N is a positive integer. In some embodiments, the switching unit 12 may include a double throw double pole (DTDP) switch. The switching unit 12 may include a pair of pole ports 12p, a first pair of throw ports 12t1, and a second pair of throw ports 12t2. Referring to FIG. 4, the first operation mode M1 is selected when the pair of pole ports 12p and the first pair of throw ports 12t1 are connected. The power source 13 is connected to the measuring module 11 via the switching unit 12. When the second operation mode M2 is selected, the pair of pole ports 12p and the second pair of throw ports 12t2 are connected. When the second operation mode M2 is selected, the power source 13 is disconnected from the measuring module 11. In some embodiments, the switching unit 12 may include a single pole single throw (SPST) switch, a single pole double throw (SPDT) switch, a double pole single throw (DPST) switch, or other suitable switches.

An electronic component 14 can be connected between the power source 13 and the switching unit 12. The electronic component 14 can be connected between a positive terminal of the power source 13 and the first pair of throw poles 12t1 of the switching unit 12. The electronic component 14 can be used for reverse battery protection. The electronic component 14 may prevent a reverse connection between the other elements of the main circuit 1 and the power source 13. In some embodiments, the electronic component 14 may include a diode having an anode connected to the positive terminal of the power source 13 and a cathode connected to the switching unit 12.

The wireless communication module 15 can be configured to receive the electrical signals measured by the measuring module 11 and transmit a data packet including the electrical signals wirelessly. The wireless communication module 15 can transmit data packets including the electrical signals via Bluetooth, Bluetooth low energy, Wi-Fi, or NFC. For example, the wireless communication module 15 may receive the electrical signals S1, S2, S1', or S2' and transmit a data packet including one or more of the electrical signals S1, S2, S1', or S2'.

Figure 6A:
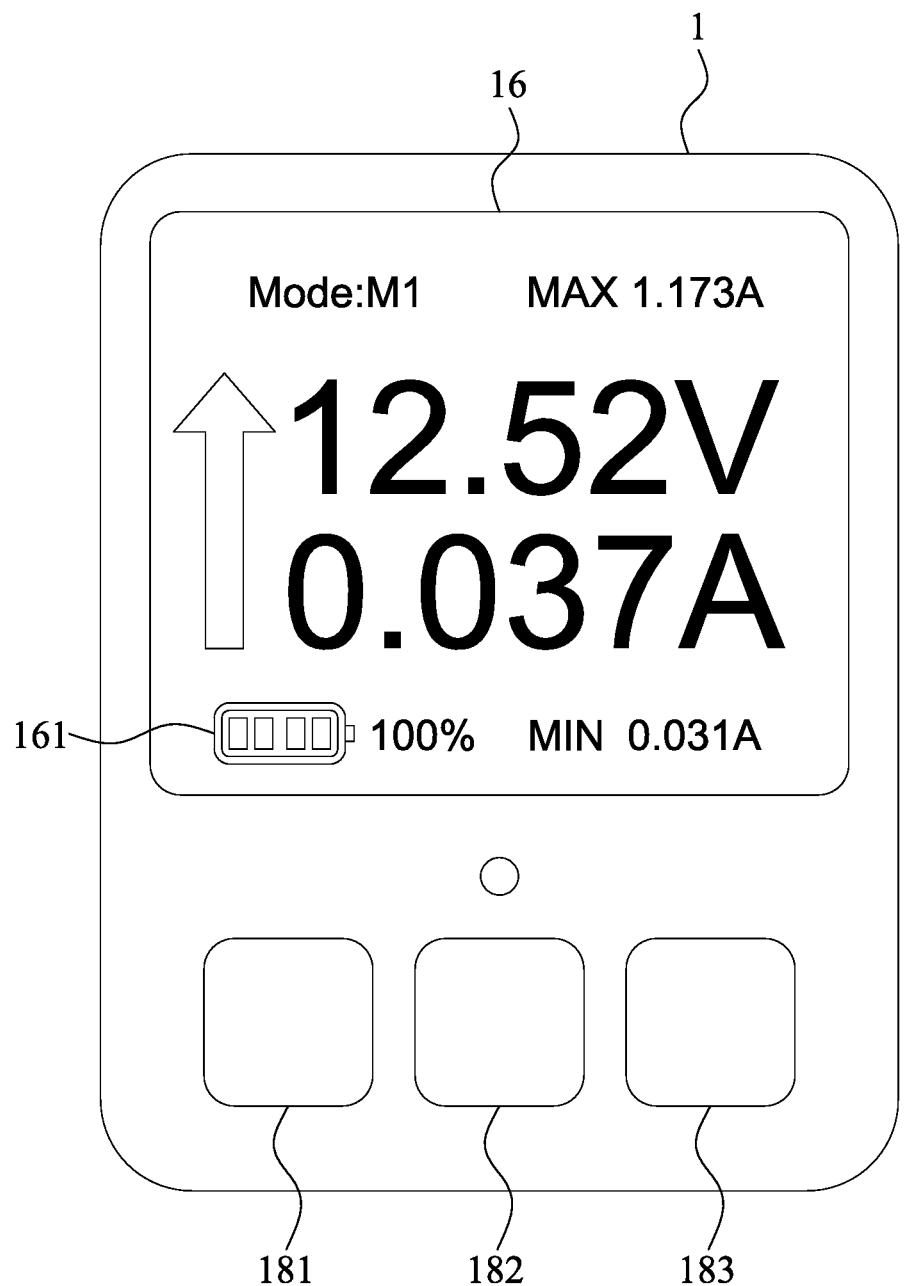
FIG. 6A, FIG. 6B, and FIG. 6C each illustrate a user interface of an electronic device, according to some embodiments of the present disclosure.
Figure 6B:
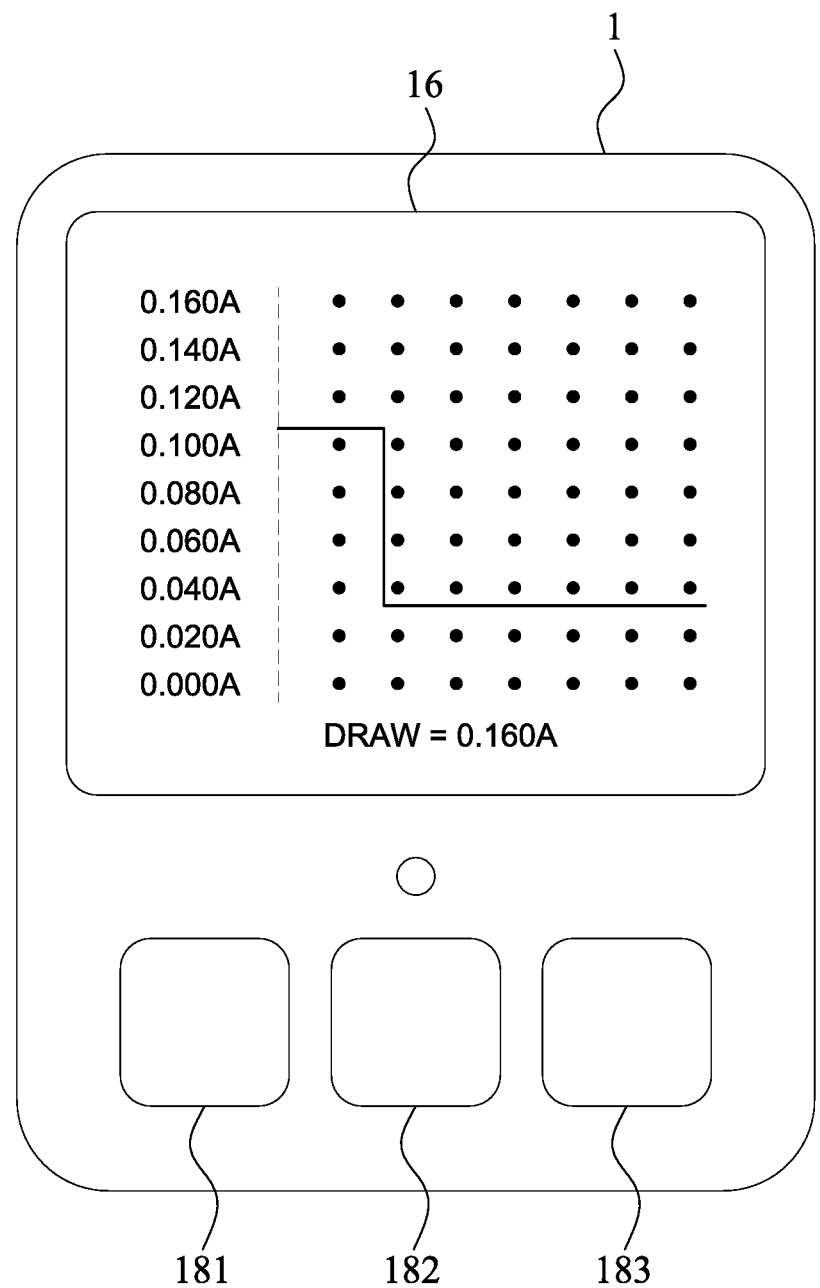
Figure 6C:
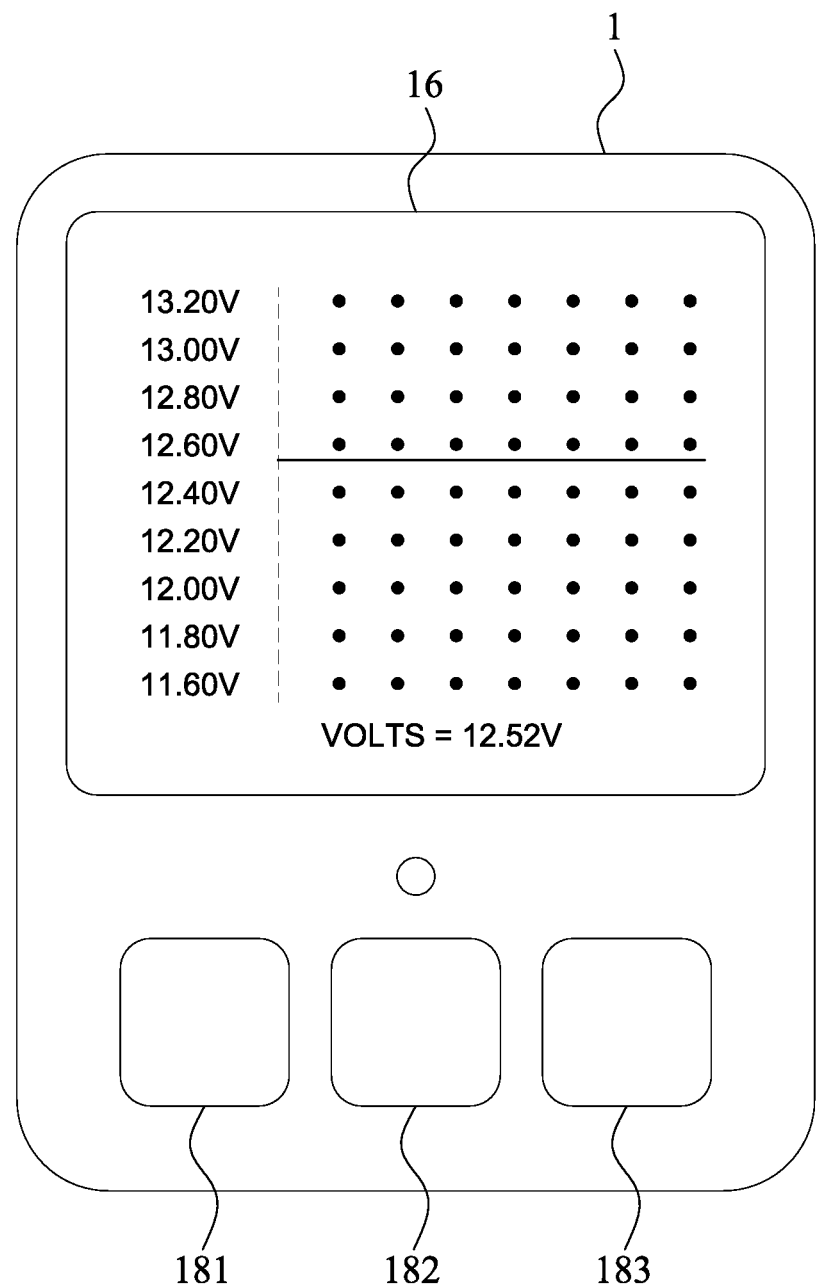

FIG. 6A, FIG. 6B, and FIG. 6C each illustrate a user interface of the electronic device 100 according to some embodiments of the present disclosure. As shown in FIG. 6A, the display unit 16 of the electronic device 100 is configured to display a real-time value (e.g., 0.037 A as shown in FIG. 6A) associated with the electrical signal S1 or the electrical signal S1' and a real-time value (e.g., 12.52V as shown in FIG. 6A) associated with the electrical signal S2 or the electrical signal S2'. As shown in FIG. 6B, the display unit 16 of the electronic device 100 is configured to display a trend chart of the electrical signal S1 or the electrical signal S1'. As shown in FIG. 6C, the display unit 16 of the electronic device 100 is configured to display a trend chart of the electrical signal S2 or the electrical signal S2'. The display unit 16 of the electronic device 100 can show an indicator 161 indicating the information associated with the power source 13 of the electronic device 100. The indicator 161 can be a visual indication of remaining battery percentage of the power source 13. The indicator 161 can be a visual indication of the power source 13's state of charge.

Referring to FIG. 6A, FIG. 6B, and FIG. 6C, the electronic device 100 may include a first button 181, a second button 182, and a third button 183. The user interface of the display unit 16 of FIG. 6A can be changed to the user interface of the display unit 16 of FIG. 6B or 5C when the first button 181 is pressed. The operation mode of the electronic device 100 can be selected through the second button 182. The operation mode of the electronic device 100 can be changed when the second button 182 is pressed. The electronic device 100 can be reset when the third button 183 is pressed. In some embodiments, an alarm message can be displayed when a pre-defined condition is fulfilled. For example, the display unit 16 can be configured to display an alarm message when the value of the electrical signal S1 or the value of the electrical signal S1' exceeds a threshold value. The threshold value can be pre-configured. In some embodiments, the threshold value can be about 50 mA.

Figure 7:
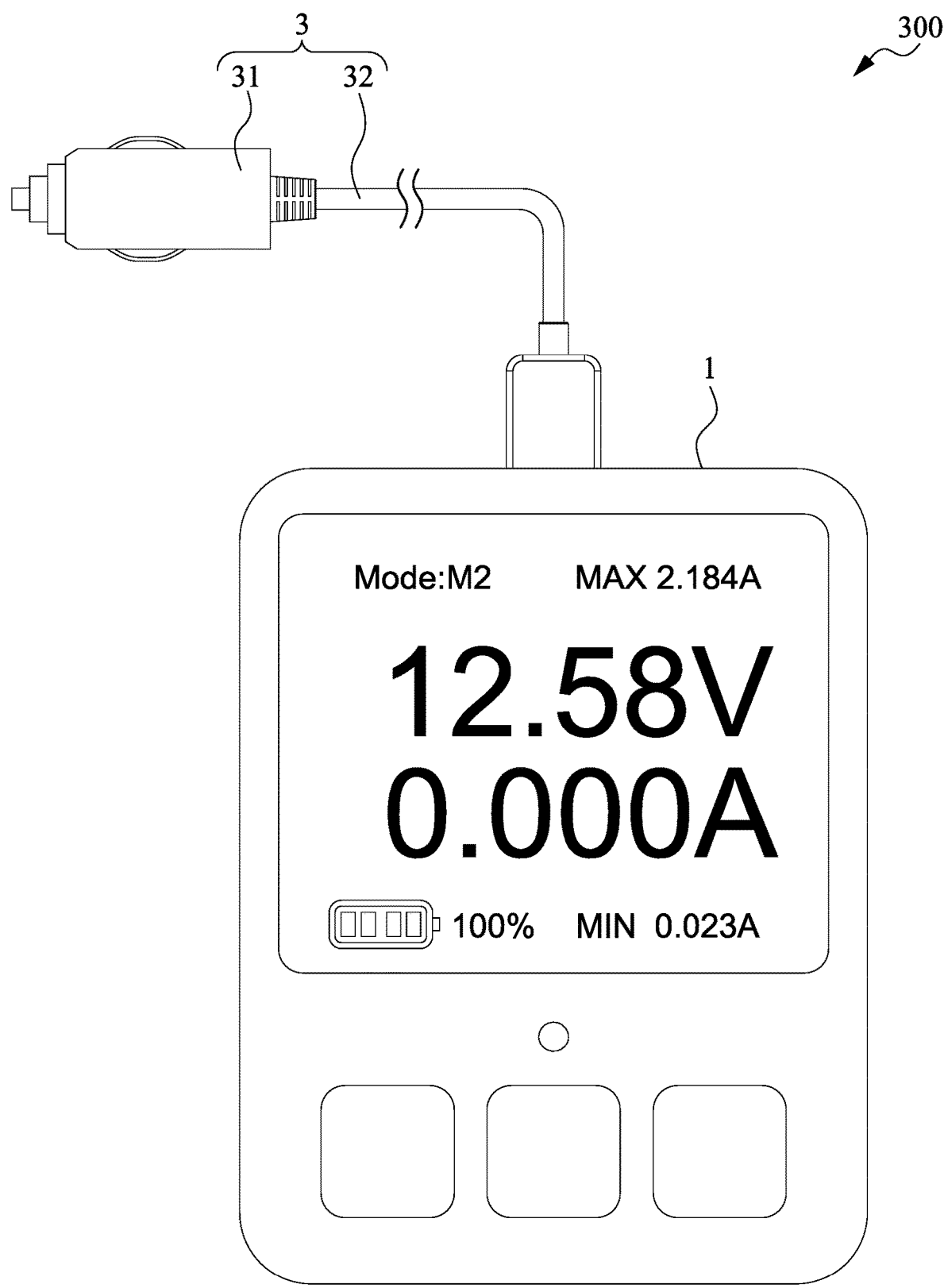
FIG. 7 illustrates a schematic diagram of an electronic device, according to some embodiments of the present disclosure.

FIG. 7 illustrates a schematic diagram of an electronic device 300 according to some embodiments of the present disclosure. The electronic device 300 of FIG. 7 is similar to the electronic device 100 of FIG. 1, and the differences therebetween are described below.

As shown in FIG. 7, the electronic device 300 of FIG. 7 includes a connecting element 3, instead of the connecting element 2 of FIG. 1. The connecting element 3 may include a connector 31 and a cable 32 connected to the connector 31. The main circuit 1 can be connected to the connecting element 3. For example, the main circuit 1 may include a receiving port(s) connected to the cable 32. The main circuit 1 can be disconnected from the connecting element 3. The receiving port(s) of the main circuit 1 can be disconnected from the cable 32.

The connector 31 may include a cigar light plug or the like. The cable 32 may include a coaxial cable or the like.

Figure 8:
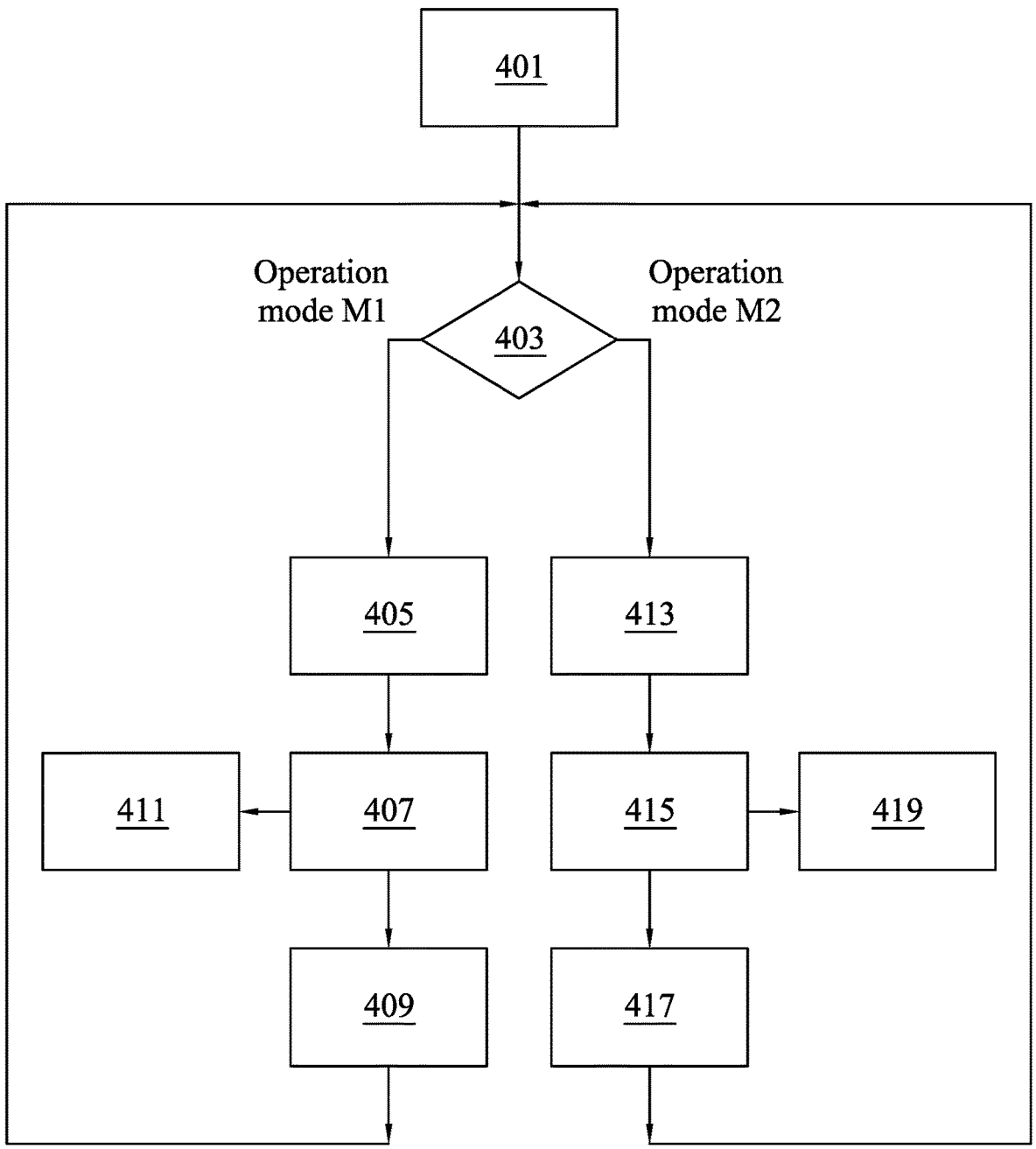
FIG. 8 illustrates a flow chart showing a method of operating an electronic device, according to some embodiments of the present disclosure.

FIG. 8 illustrates a flow chart showing a method 400 of operating an electronic device (e.g., the electronic device 100 or the electronic device 300) according to some embodiments of the present disclosure. The method 400 may include operations 401, 403, 405, 407, 409, 411, 413, 415, 417, and 419.

In operation 401, an electronic device is electrically coupled to an external system. For example, operation 401 may include electrically coupling the electronic device 100 to the vehicle electrical system 200 through the connector 21 of the electronic device 100.

In operation 403, the operation mode of the electronic device can be selected/determined. For example, operation 403 may include, by using the switch unit 12, determining whether the electronic device 100 should be operated in the first operation mode M1 or the second operation mode M2.

Although the operation 403 is depicted in FIG. 8 as following the operation 401, in some embodiments, the operation 403 can be performed prior to the operation 401. That is, the operation mode of the electronic device 100 can be selected/determined before it is electrically coupled to the vehicle electrical system 200.

When the electronic device 100 is determined to be operated in the first operation mode M1, operation 405 would be performed. In operation 405, a power source of the electronic device is electrically coupled to a measuring module of the electronic device. For example, operation 405 may include electrically coupling the measuring module 11 between the power source 13 and the connector 21.

In operation 407, an electrical signal communicated between the power source and the connector of the electronic device can be measured. For example, operation 407 may include, by using the measuring module 11 (or the first measuring unit 111), measuring the electrical signal S1 communicated between the power source 13 and the connector 21. Furthermore, operation 407 may include, by using the measuring module 11 (or the second measuring unit 112), measuring the electrical signal S2 of the power source 13.

In operation 409, real-time values of electrical signals can be displayed. In addition, an alarm message can be displayed when a pre-defined condition is fulfilled. For example, operation 409 may include displaying a real-time value of the electrical signal S1 and a real-time value of the electrical signal S2 on the display unit 16. Furthermore, operation 409 may include displaying an alarm message on the display unit 16 when a value of the electrical signal S1 exceeds a threshold value. The threshold value can be about 50 mA.

In operation 411, data packets associated with the electrical signals measured in operation 407 can be wirelessly transmitted. For example, operation 411 may include, by using the wireless transmission module 15, transmitting a data packet including the electrical signal S1 or the electrical signal S2 via Bluetooth, Bluetooth low energy, Wi-Fi, or NFC.

After the operation 409, the operation 403 can start over again if a next measurement is necessary.

When the electronic device is determined to be operated in the second operation mode M2, operation 413 would be performed. In operation 413, a power source of the electronic device is electrically isolated from a connector of the electronic device. For example, operation 413 may include electrically isolating the power source 13 from the connector 21.

In operation 415, an electrical signal communicated between the power source and the connector of the electronic device can be measured. For example, operation 415 may include, by using the measuring module 11 (or the first measuring unit 111), measuring the electrical signal S1' from the connector 21. Furthermore, operation 415 may include, by using the measuring module 11 (or the second measuring unit 112), measuring the electrical signal S2' associated with a car battery of the vehicle electrical system 200. The electrical signal S1 and the electrical S1' can be substantially the same. The electrical signal S2 and the electrical S2' can be substantially the same.

In operation 417, real-time values of electrical signals can be displayed. In addition, an alarm message can be displayed when a pre-defined condition is fulfilled. For example, operation 417 may include displaying a real-time value of the electrical signal S1' and a real-time value of the electrical signal S2' on the display unit 16. Furthermore, operation 417 may include displaying an alarm message on the display unit 16 when a value of the electrical signal S1' exceeds a threshold value. The threshold value can be about 50 mA.

In operation 419, data packets associated with the electrical signals measured in operation 415 can be wirelessly transmitted. For example, operation 419 may include, by using the wireless transmission module 15, transmitting a data packet including the electrical signal S1' or the electrical signal S2' via Bluetooth, Bluetooth low energy, Wi-Fi, or NFC.

After the operation 417, the operation 403 can start over again if a next measurement is necessary.

By performing the method as shown in FIG. 8, the electronic device 100 can be electrically coupled to the vehicle electrical system 200 via the connector 21 so as to measure the drain current of the vehicle electrical system 200, instead of placing an ammeter in-line between the car battery and battery cables. As such, the present disclosure may prevent the temporary disconnection in the transmission path and thus prevent the loss of power. The electronic device 100 can be used for measuring the voltages associated with the car battery or the power source 13. The electronic device 100 can be used for measuring the currents associated with the car battery or the power source 13. Furthermore, since the electronic device 100 provides the power to the vehicle electrical system 200, a car battery can be removed for repair or replacement without any concerns about a loss of power. The adaptation stored in the vehicle electrical system 200 may thus be retained.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

As used herein, the singular terms "a," "an," and "the" may include plural referents unless the context clearly dictates otherwise.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes can be made and equivalents can be substituted without departing from the true spirit and scope of the present disclosure as defined by the appended claims. The illustrations may not be necessarily drawn to scale. There can be distinctions between the artistic renditions in the present disclosure and the actual apparatus due to manufacturing processes and tolerances. There can be other embodiments of the present disclosure which are not specifically illustrated. The specification and drawings are to be regarded as illustrative rather than restrictive. Modifications can be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations can be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
a connector;
a first measuring unit;
a second measuring unit;
a power source; and
a switching unit configured to switch the electronic device between a first operation mode and a second operation mode;
wherein, when the first operation mode is selected, the first measuring unit is configured to be electrically coupled between the power source and the connector so as to measure a first electrical signal communicated between the power source and the connector, and the second measuring unit is configured to measure a second electrical signal of the power source,
wherein the first electrical signal is a current associated with the power source and the second electrical signal is a voltage associated with the power source,
wherein the first measuring unit is configured to form a series circuit with the connector and the power source when the electronic device is switched to the first operation mode, and the second measuring unit is configured to form a parallel circuit with the connector.

2. The electronic device of claim 1, wherein the power source is electrically isolated from the connector when the second operation mode is selected.

3. The electronic device of claim 1, wherein:
the switching unit comprises a first pair of pole ports, a first pair of throw ports, and a second pair of throw ports,
the first operation mode is selected when the first pair of poles and the first pair of throw ports are connected, and
the second operation mode is selected when the first pair of poles and the second pair of throw ports are connected.

4. The electronic device of claim 1, wherein the first electrical signal is a drain current from the power source to the connector.

5. The electronic device of claim 2, wherein a value of the first electrical signal is substantially the same when the switching unit selects either the first operation mode or the second operation mode.

6. The electronic device of claim 1, wherein the connector is an on-board diagnostic (OBD) connector.

7. The electronic device of claim 1, further comprising a display unit configured to display an alarm message when the value of the first electrical signal exceeds a first threshold value.

8. The electronic device of claim 7, wherein the first measuring unit further measures a second electrical signal associated with the power source when the first operation mode is selected, and wherein the display unit is configured to display a first real-time value associated with the first electrical signal and a second real-time value associated with the second electrical signal.

9. An electronic device, comprising:
a connector;
a main circuit connected to the connector, the main circuit comprising:
    a switching unit configured to switch the electronic device between a first operation mode and a second operation mode;
    a first measuring unit connected to the switching unit;
    a second measuring unit connected to the switching unit; and
    a power source connected to the switching unit,
wherein, when the first operation mode is selected, the first measuring unit measures a first drain current from the power source to the connector, and the second measuring unit is configured to measure a second electrical signal of the power source,
wherein the first measuring unit is configured to form a series circuit with the connector and the power source when the electronic device is switched to the first operation mode, and the second measuring unit is configured to form a parallel circuit with the connector, and
wherein, when the second operation mode is selected, the first measuring unit measures a second drain current from the connector.

10. The electronic device of claim 9, wherein the first drain current and the second drain current are substantially the same.

11. The electronic device of claim 9, wherein, when the first operation mode is selected, the power source is configured to be electrically coupled to an external system through the connector.

12. The electronic device of claim 9, wherein, when the second operation mode is selected, the power source is electrically isolated from the connector.

13. A method for operating an electronic device, comprising:
    switching the electronic device to a first operation mode;
    electrically coupling the electronic device to an external system through a connector of the electronic device;
    measuring, by a first measuring unit of the electronic device, a first electrical signal communicated between the power source of the electronic device and the external system; and
    measuring, by a second measuring unit of the electronic device, a second electrical signal of the power source,
    wherein the first electrical signal is a current associated with the power source and the second electrical signal is a voltage associated with the power source,
    wherein the first measuring unit forms a series circuit with the connector and the power source when the electronic device is switched to the first operation mode, and the second measuring unit forms a parallel circuit with the connector.

14. The method of claim 13, further comprising electrically isolating the power source of the electronic device from the connector when a second operation mode is selected.

15. The method of claim 13, wherein the first electrical signal is a drain current from the power source to the external system.

16. The method of claim 13, further comprising displaying an alarm message on a display unit of the electronic device when the value of the first electrical signal exceeds a first threshold value.

17. The method of claim 13, further comprising:
    displaying a first real-time value of the first electrical signal and a second real-time value of the second electrical signal on a display unit of the electronic device.

* * * * *